(12) United States Patent
MacIntyre

(10) Patent No.: US 6,753,208 B1
(45) Date of Patent: Jun. 22, 2004

(54) WAFER SCALE METHOD OF PACKAGING INTEGRATED CIRCUIT DIE

(75) Inventor: Donald Malcolm MacIntyre, San Jose, CA (US)

(73) Assignee: MCSP, LLC, San Jose, CA (US)

( * ) Notice: Subject to any disclaimer, the term of this patent is extended or adjusted under 35 U.S.C. 154(b) by 0 days.

(21) Appl. No.: 10/224,197

(22) Filed: Aug. 19, 2002

Related U.S. Application Data

(60) Continuation of application No. 09/686,016, filed on Oct. 10, 2000, now Pat. No. 6,555,469, which is a division of application No. 09/045,507, filed on Mar. 20, 1998.

(51) Int. Cl.⁷ .......................... H01L 21/44; H01L 21/48; H01L 21/50; H01L 23/48; H01L 23/52
(52) U.S. Cl. .................. 438/118; 438/110; 438/125; 257/782; 257/783
(58) Field of Search .................. 438/110, 118, 438/125; 257/782, 783

(56) References Cited

U.S. PATENT DOCUMENTS

| | | | |
|---|---|---|---|
| 4,356,374 A | 10/1982 | Noyori et al. | 219/121 |
| 5,252,850 A | * 10/1993 | Schempp | 257/433 |
| 5,258,648 A | 11/1993 | Lin | 257/778 |
| 5,468,681 A | 11/1995 | Pasch | 438/183 |
| 5,705,858 A | * 1/1998 | Tsukamoto | 257/778 |
| 5,814,894 A | 9/1998 | Igarashi et al. | 257/787 |
| 5,844,304 A | 12/1998 | Kata et al. | 257/620 |
| 5,849,606 A | * 12/1998 | Kikuchi et al. | 438/108 |
| 5,859,407 A | * 1/1999 | Saiki et al. | 219/209 |
| 5,886,971 A | * 3/1999 | Feldman et al. | 369/112 |
| 5,973,337 A | 10/1999 | Knapp et al. | 257/99 |
| 6,300,235 B1 | 10/2001 | Feldner et al. | 438/618 |
| 6,303,977 B1 | 10/2001 | Schroen et al. | 257/635 |

* cited by examiner

Primary Examiner—Jack Chen
Assistant Examiner—Nema Berezny
(74) Attorney, Agent, or Firm—Stallman & Pollock LLP

(57) ABSTRACT

A chip scale package structure formed by adhering a glass sheet having a pattern of holes matching a pattern of bond pads on a semiconductor wafer so that the pattern of holes on the glass sheet are over the pattern of bond pads on the semiconductor wafer. Metallized pads are formed on the glass sheet adjacent to each hole and in one embodiment a conductive trace is formed from each metallized pad on the glass sheet to the bond pad on the semiconductor wafer under the adjacent hole. In a second embodiment, a pad is formed on the glass sheet adjacent to each hole and the pad extends down the sides of the adjacent hole. The hole is filled with a metal plug that electrically connects the pad on the glass sheet to the bond pad on the semiconductor wafer. In each embodiment, a solder ball is formed on each pad on the glass sheet.

9 Claims, 3 Drawing Sheets

WAFER SCALE METHOD OF PACKAGING INTEGRATED CIRCUIT DIE

RELATED APPLICATIONS

This application is a continuation of commonly-assigned application Ser. No. 09/686,016, filed Oct. 10, 2000 U.S. Pat. No. 6,555,469, which is divisional of commonly-assigned application Ser. No. 09/045,507, filed Mar. 20, 1998.

BACKGROUND OF THE INVENTION

1. Field of the Invention

This invention relates generally to flip chip packaging technology and even more specifically, this invention relates to chip scale flip chip packaging technology for semiconductor die.

2. Discussion of the Related Art

Chip Scale Packages (CSP) for semiconductor die currently embody some form of solder ball or bump to attach the die to the next higher assembly in the total package. In the simplest form of a CSP, the CSP is a flip chip semiconductor die that has additional solder bumps to be connected to normal bond pads on a substrate which are used to wire bond interconnect to a package or substrate. The semiconductor die is inverted and the solder is reflow melted which structurally attaches the die to the metallized pads or to traces on the substrate.

The solder-bump flip-chip interconnection technology was initiated in the early 1960s to eliminate the expense, unreliability, and low productivity of manual wirebonding. The so-called controlled-collapse-chip connection $C^4$ or C4 utilizes solder bumps deposited on wettable metal terminals on the chip which are joined to a matching footprint of solder wettable terminals on the substrate. The upside-down chip (flip chip) is aligned to the substrate and all joints are made simultaneously by reflowing the solder.

The most recent innovations to the flip chip technology involve the relocation of the solder ball/bump sites from the close pitch pads which are normally placed around the perimeter of the semiconductor die to an array located across the surface of the die. This is accomplished by creating new traces from the perimeter locations to the new array locations on top of a passivation layer. The passivation layer is typically a glass protective layer deposited on the surface of the die with openings to expose the bond pads or by adding an interposer connector, which is bonded to the existing pads and reroutes traces to the array. An interposer connector is a connector structure that is routed between two parts to be connected.

A current interposer connector process reroutes connectors to the pads by extending them into the space between adjacent die as created on the semiconductor wafer, laminating a piece of glass to either side of the wafer and then through a complex series of mechanical cutting, metal deposition and etching operations, the connectors to the pads are extended to the surface of the glass. This produces an array on the top of the glass sheet covering the die, which is in turn adhesively bonded to the passivation surface of the die. The advantage of this process and structure is that the glass sheet provides a protective surface for the delicate surface of the passivated die and allows some degree of differential expansion between the die surface and the array of solder balls due to the non rigid nature of the adhesive layer. The disadvantages are that the extension of the connectors to the pads on the wafer are difficult to implement and often prevent the process from being possible, the glass cutting operation is costly and requires special equipment, the process is implemented on a completed semiconductor wafer which is very sensitive and costly and any error causes the entire wafer to be scrapped, and two sheets of glass are always required.

Therefore, what is needed is a chip scale flip chip process that is easy to implement, uses one glass sheet and is inexpensive.

SUMMARY OF THE INVENTION

According to the present invention, the foregoing and advantages are attained by a method and structure for a chip scale package formed by adhering a glass sheet having a pattern of holes matching a pattern of bond pads on a semiconductor wafer so that the pattern of holes on the glass sheet are over the pattern of bond pads on the semiconductor wafer. In one aspect of the invention, metallized pads are formed on the glass sheet adjacent to each hole and in one embodiment a metal trace is formed from each metallized pad on the glass sheet to the pad on the semiconductor wafer under the adjacent hole. In another aspect of the invention, a pad is formed on the glass sheet adjacent to each hole and the pad extends down the sides of the adjacent hole. In the second aspect, the hole is filled with a metal plug that electrically connects the pad on the glass sheet to the bond pad on the semiconductor wafer. In each aspect of the invention, a solder or conductive ball is formed on each pad on the glass sheet.

The present invention is better understood upon consideration of the detailed description below, in conjunction with the accompanying drawings. As will become readily apparent to those skilled in the art from the following description, there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention that illustrate the best mode presently contemplated by the inventor for practicing the invention.

FIGS. 1A–1D illustrates how the structure of a glass sheet and semiconductor wafer is formed in accordance with the present invention and a resulting individual chip sawn or cut from the glass sheet/semiconductor wafer structure.

Figure 1A:
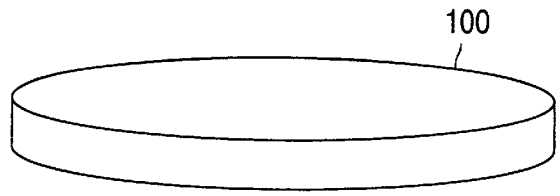
FIG. 1A shows a glass sheet that is to be used in the present invention.

FIG. 1A shows a glass sheet 100. The glass sheet 100 is substantially the same size as the semiconductor wafer to which it will be adhered. The material of the glass sheet is made from a material having a coefficient of expansion that matches the coefficient of expansion of the semiconductor wafer to reduce the stress placed on the wafer due to temperature variations. In addition, the coefficient of expansion of the glass sheet material can be chosen to also reduce the stress placed on the interconnections to the next level of substrate.

Figure 1B:
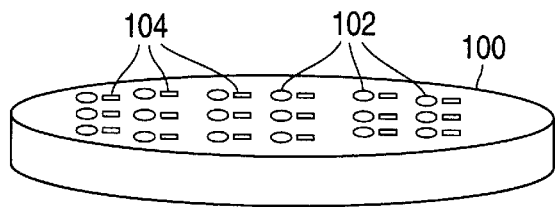
FIG. 1B shows the glass sheet shown in FIG. 1A after being prepared to be adhered to a semiconductor wafer.

FIG. 1B shows the glass sheet 100 with holes 102 etched into and through the glass sheet 100. It should be appreciated that only a few of the many holes are shown in the surface of the glass sheet 100. The holes 102 are in a pattern that matches a pattern of bond pads on a semiconductor wafer to which the glass sheet is to be adhered. Also shown are pads 104 formed on the surface of the glass sheet 100 adjacent to the holes 102. It should also be understood that only a few of the many pads are shown formed on the surface of the glass sheet 100. The details of the holes 102 and pads 104 are discussed below.

Figure 1C:
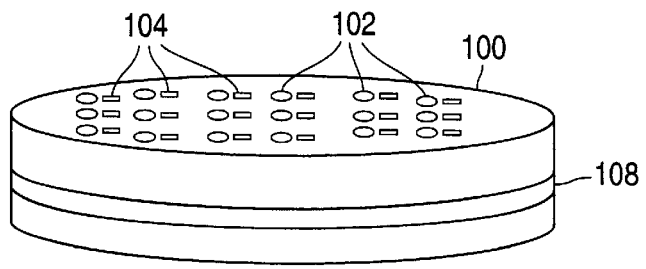
FIG. 1C shows the glass sheet shown in FIG. 1B adhered to a semiconductor wafer.

FIG. 1C shows the glass sheet 100 adhered to a semiconductor wafer 106 by a layer 108 of adhesive. The glass sheet 100 and layer 108 of adhesive provide electrical insulation from the circuitry on the wafer 106.

Figure 1D:
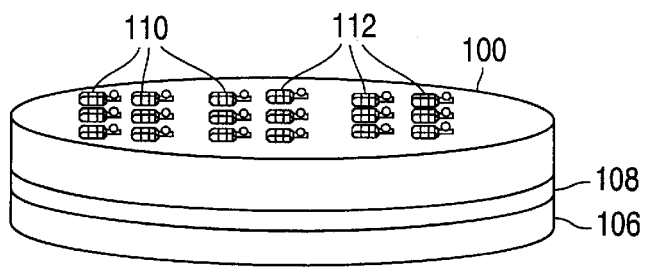
FIG. 1D shows the completed glass sheet/semiconductor wafer structure.

FIG 1D shows the structure shown in FIG. 1C with the holes 102 filled with a conducting material 110 and solder balls 112 formed on the pads 104.

Figure 1E:
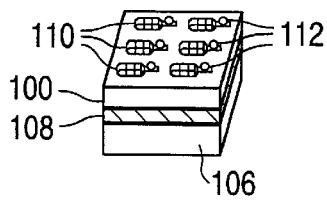
FIG. 1E shows an individual chip that has been sawn or cut from the glass sheet/semiconductor structure shown in FIG. 1D.

FIG. 1E shows an individual chip 114 that has been sawn or cut from the glass sheet/semiconductor structure shown in FIG. 1D. It should be understood that there are many more hole/solder ball structures on an actual chip 114.

FIG. 2A–2G illustrate a method of forming a glass sheet/semiconductor wafer structure according to a first embodiment of the present invention.

Figure 2A:
FIG. 2A shows a cross-section of a portion of the glass sheet shown in FIG. 1A.

FIG. 2A shows a cross-section 200 of a portion of the glass sheet 100 shown in FIG. 1A. FIG. 2B shows a hole (via) 202 etched through the portion of the glass sheet 200. The hole 202 can have tapered sides 204 and 206 or the sides can be non-tapered. The placement of the hole 202 corresponds to a position of a bond pad that is formed on the wafer to which the glass sheet is to be adhered. A pad 208 is formed on the surface of the glass sheet 200 adjacent to each hole 202. Typically, the pad 208 is formed from a metal such as aluminum or nickel. However, the glass sheet 200 can be pre-metallized with other metals such as gold or copper.

Figure 2E:
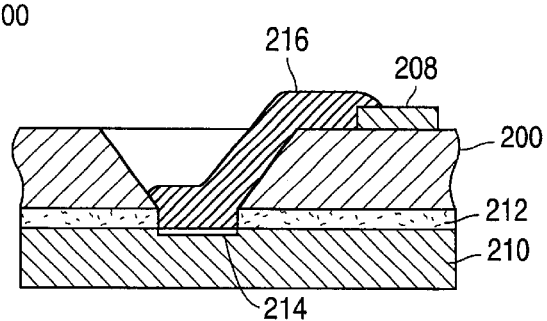
FIG. 2E shows the trace formed from the-pad on the semiconductor wafer to the pad on the glass sheet.
Figure 2B:
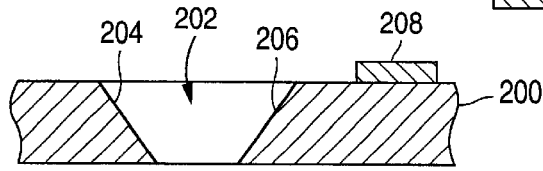
FIG. 2B shows the portion of the cross-section of the glass sheet shown in FIG. 2A with a hole formed in the glass sheet and a pad formed on the surface of the glass sheet.
Figure 2F:
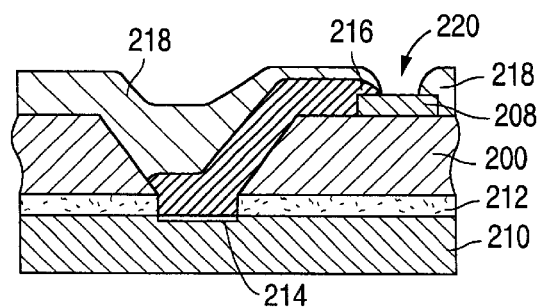
FIG. 2F shows the structure shown in FIG. 2E with a masking layer formed to allow formation of a solder ball on the pad on the glass sheet.
Figure 2C:
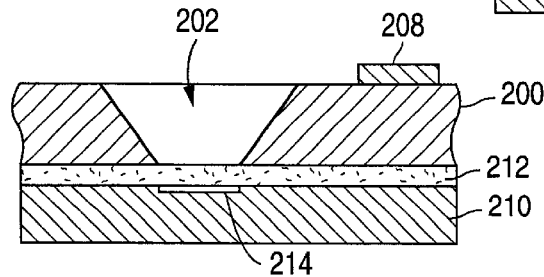
FIG. 2C shows the cross-section of the glass sheet shown in FIG. 2B after the glass sheet has been adhered to a semiconductor wafer as shown in FIG. 1C.

FIG. 2C shows the portion of the glass sheet 200 adhered to a portion of a wafer 210 with a layer of adhesive 212. A metallization pad 214 is shown formed on the surface of the wafer 210. The layer of adhesive 212 is made from an epoxy that electrically insulates the circuitry on the wafer 210 and, in addition, provides stability to the glass sheet/semiconductor wafer structure. The layer of adhesive 212 conforms to the surface of the semiconductor wafer with or without a passivation layer protecting the semiconductor wafer 210 from the glass sheet 200. The layer of adhesive 212 is sufficiently compliant to allow a slight mismatch in the coefficient of expansions of the glass sheet 200 and semiconductor wafer 210 thus reducing any stress placed on the semiconductor wafer by a temperature change. The electrical insulation can be increased by increasing the thickness of the glass sheet and/or the thickness of the layer of adhesive 212. The signal impedance of the device can be controlled by the selection of the glass material for the glass sheet 300, the selection of the material for the metal pad 308 and by the selection of the layout design parameters.

Figure 2G:
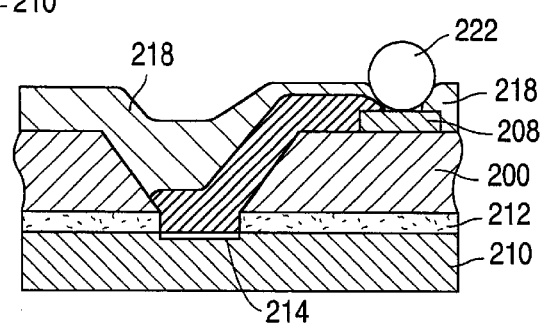
FIG. 2G shows the structure shown in FIG. 2F with the solder ball formed on the pad on the glass sheet.
Figure 2D:
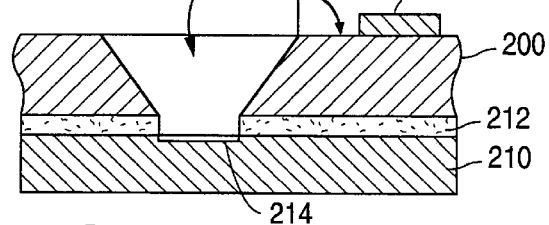
FIG. 2D shows the glass sheet/semiconductor wafer structure as shown in FIG. 2C pre ed for the formation of conductive traces from a bond pad on the semiconductor wafer to the pad on the glass sheet.

FIG. 2D shows the structure shown in FIG. 2C with the layer of adhesive over bond pad 214 removed to allow access to the pad 214. The adhesive over the pad 214 is removed by a plasma etch process.

FIG. 2E shows the structure shown in FIG. 2D with a conductive trace 216 formed that electrically connects pad 208 to the bond pad 214 in the semiconductor wafer 210. The conductive trace 216 bridges the gap between the glass sheet 200 and the semiconductor wafer 210 created by the thickness of the layer of adhesive 212. Typically, aluminum is utilized for metallization of bond pads 208 and therefore, deposition of aluminum with an etch removal of excess aluminum is the preferred method of obtaining the bridge metallization. Alternative methods include, but are not limited to a mechanical application of metal such as gold or aluminum, metal plug application in the opening or the use of a conductive polymer such as an epoxy filled with a conductive material such as aluminum flakes. The conductive trace 216 is typically aluminum. Other pad metals may be used and the choice of bridge material and application technique could be varied as appropriate and would be within the skill of a person of ordinary skill in the art. The pre-metallization of the glass sheet 200 allows the use of different metals for the conductive trace 216, pad 208 and the bond pad 214. The use of a glass sheet 200 allows the use of a metal for the conductive trace 216 that would otherwise require the use of a diffusion barrier layer between the semiconductor pad 214 and the conductive trace 216 on the glass sheet 200 without having to use a diffusion barrier layer. A typical process would be to metallize the glass with copper or gold and then deposit aluminum in the opening 202 as the bridge or trace metal. Since aluminum is the most common bond pad material, the use of aluminum as a bridge or trace metal does not adversely affect the bond pad 214 and aluminum is compatible with whatever metal is used as the conductive trace 216.

FIG. 2F shows the structure shown in FIG. 2E with a mask 218 formed on the surface of the structure shown in FIG. 2E. A hole 220 is etched in the mask 218 over the pad 208 in order for a solder ball to be formed on the pad 208.

FIG. 2G shows the structure shown in FIG. 2F with a solder ball 222 formed on the pad 208. The solder ball 222 allows attachment to a next level of interconnect and is a normal practice for chip scale packages and ball grid array packages. Typically, the solder ball 222 is a tin and lead composition, however, other attachment materials can be used such as a metal bump or a polymer conductive bump.

FIGS. 3A–3G illustrate a method of forming a glass sheet/semiconductor wafer structure according to a second embodiment of the present invention.

Figure 3A:
FIG. 3A shows a cross-section of a portion of the glass sheet shown in FIG. 1A.
Figure 3B:
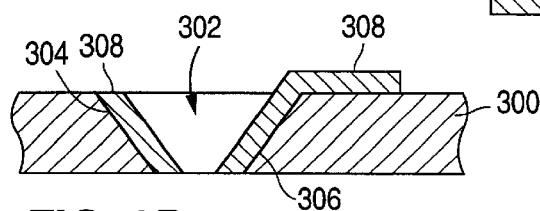
FIG. 3B shows the portion of the cross-section of the glass sheet shown in FIG. 3A with a hole formed in the glass sheet and a pad formed on the surface of the glass sheet with a portion of the pad extending down the sides of the hole in the glass sheet.

FIG. 3A shows a cross-section 300 of a portion of the glass sheet 100 shown in FIG. 1A. FIG. 3B shows a hole (via) 302 etched through the portion of the glass sheet 300. The hole 302 can have tapered sides 304 and 306 as shown or the sides can be non-tapered. The placement of the hole 302 in the glass sheet 300 corresponds to a position of a pad that is formed on the wafer to which the glass sheet is to be adhered. A metal pad 308 is formed on the surface of the glass sheet 300 and on the sides 304 and 306 of the hole 302. A metal pad 308 is formed as shown for each hole 302. Typically, the metal pad 308 is formed from a metal such as aluminum or nickel. However, the pad 308 can be formed from other metals such as gold or copper.

Figure 3C:
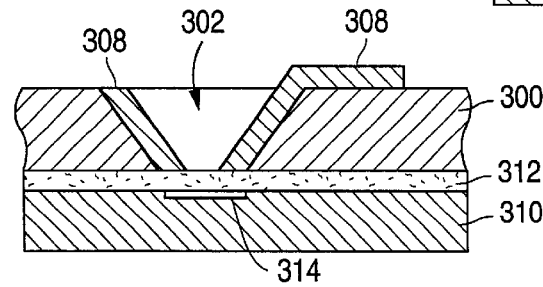
FIG. 3C shows the cross-section of the glass sheet shown in FIG. 3B after the glass sheet has been adhered to a semiconductor wafer as shown in FIG. 1C.

FIG. 3C shows the portion of the glass sheet 300 adhered to a portion of a wafer 310 with a layer of adhesive 312. A bond pad 314 is shown formed on the surface of semiconductor wafer 310. The layer of adhesive 312 is an epoxy that electrically insulates the circuitry on the wafer 310 and, in addition, provides stability to the glass sheet/semiconductor wafer structure. The layer of adhesive 312 conforms to the surface of the semiconductor wafer with or without a passivation layer protecting the wafer 310 from the glass sheet 300. The layer of adhesive 312 is sufficiently compliant to allow slight mismatch in the coefficient of expansions of glass sheet 200 and semiconductor wafer 310 thus reducing any stress placed on the semiconductor wafer by a temperature change. The electrical insulation can be increased by increasing the thickness of the glass sheet and/or the thickness of the layer of adhesive 312. The signal impedance of the device can be controlled by the selection of the glass material for the glass sheet 300, the selection of the material for the metal pad 308 and by the selection of the layout design parameters.

Figure 3D:
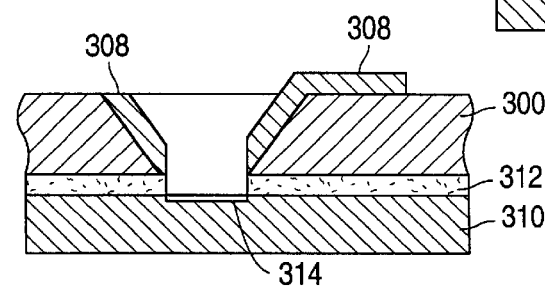
FIG. 3D shows the glass sheet/semiconductor wafer structure as shown in FIG. 3C prepared for the formation of an interconnect material to the pad on the wafer.

FIG. 3D shows the structure shown in FIG. 3C with the layer of adhesive over the pad 314 removed to allow access to the bond pad 314. The adhesive over the bond pad 314 is removed by a plasma etch process.

Figure 3E:
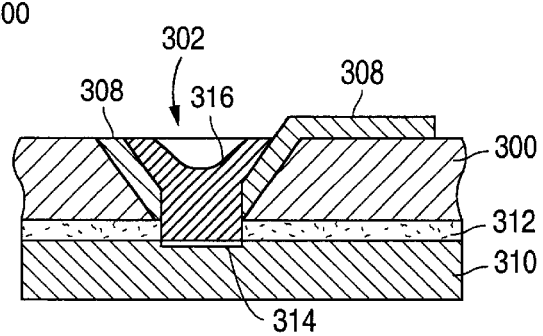
FIG. 3E shows the structure shown in FIG. 3D with a masking layer formed to allow formation of a solder ball on the pad on the surface of the glass sheet.

FIG. 3E shows the structure shown in FIG. 3D with a metal plug 316 formed in the hole 302. The metal plug 316 electrically connects pad 308 to bond pad 314 in the semiconductor wafer 310. The metal plug 316 bridges the gap between the glass sheet 300 and the wafer 310 created by the thickness of the layer of adhesive 312. Typically, aluminum is utilized for metallization of bond pads 308 and therefore, deposition of aluminum with an etch removal of excess aluminum is the preferred method of obtaining the plug metallization. Alternative methods include, but are not limited to a mechanical application of metal such as gold or aluminum or the use of a conductive polymer such as an epoxy filled with a conductive material such as aluminum flakes. Other applications may utilize other pad metals and the choice of a plug material and application technique could be varied as appropriate and would be within the skill of a person of ordinary skill in the art. The pre-metallization of the glass sheet 300 allows use of different metals for the metal plug 316, pad 308 and the metal trace 316. The use of glass sheet 300 allows the use of a metal for the conductive plug 316 that would otherwise require the use of a diffusion barrier layer between the bond pad 314 and the metal pad 308 on the glass sheet 300 without having to use the diffusion barrier layer. A typical process, in this case, would be to metallize the glass with copper or gold and then deposit aluminum in the opening 302 as the plug material. Since aluminum is the most common bond pad material, the use of aluminum as the plug material does not adversely affect the bond pad 314 and aluminum is compatible with whatever metal is used as the metal pad 308.

Figure 3F:
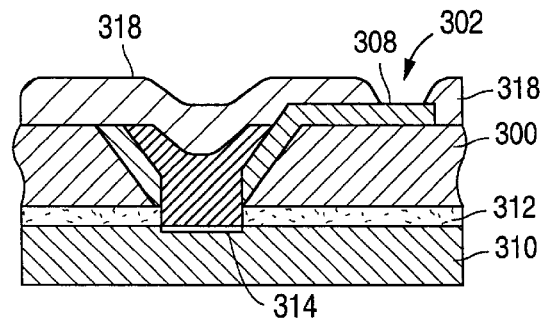
FIG. 3F shows the structure shown in FIG. 3E with a mask formed on the surface of the structure shown in FIG. 3E.

FIG. 3F shows the structure shown in FIG. 3E with a mask 318 formed on the surface of the structure shown in FIG. 3E. A hole 320 is etched in the mask 318 over a portion of the pad 308 in order for a solder ball to be formed on the pad 318.

Figure 3G:
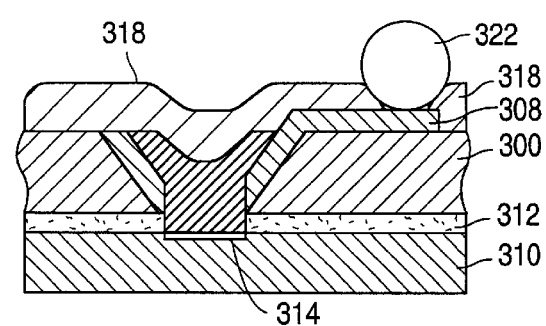
FIG. 3G shows the structure shown in FIG. 3F with a solder ball formed on the pad.

FIG. 3G shows the structure shown in FIG. 3F with a solder ball 322 formed on the pad 308. The solder ball 322 allows attachment to a next level of interconnect and is a normal practice for chip scale packages and ball grid array packages. Typically, the solder ball 322 is a tin and lead composition, however, other attachment materials can be used such as a metal bump or a polymer conductive bump.

In summary, the results and advantages of the chip scale structures of the present invention can now be more fully realized. The use of one glass sheet is easy to implement and is less costly than the current methods of producing chip scale packages.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of packaging semiconductor die wherein a plurality of individual semiconductor die are formed as part of an upper surface of a semiconductor wafer, the method comprising:

forming holes in a glass sheet, wherein the holes correspond to the location of bond pads disposed on a surface of the individual semiconductor die formed as part of the semiconductor wafer, the glass sheet having a coefficient of thermal expansion that is substantially the same as the coefficient of thermal expansion of the semiconductor wafer;

depositing a first layer of conductive material on a first surface of the glass sheet;

etching the first layer of conductive material to form conductive pads on the first surface of the glass sheet adjacent to the holes in the glass sheet;

affixing a second surface of the glass sheet to the upper surface of the semiconductor wafer utilizing an adhesive such that the holes in the glass sheet are aligned to match the location of the bond pads disposed on the surface of the individual semiconductor die;

etching the adhesive such that the adhesive is removed from the bond pads;

forming a patterned second layer of conductive material on the first surface of the glass sheet to create conductive traces that electrically connect the conductive pads through the holes in the glass sheet to the bond pads; and forming solder balls on the conductive pads.

2. The method of claim 1, and further comprising:

cutting the semiconductor wafer with the affixed glass sheet into individual semiconductor die.

3. The method of claim 1, and wherein the semiconductor wafer comprises silicon.

4. A method of making a wafer scale structure for packaging integrated circuits, the method comprising:

providing a monolithic substrate wafer of semiconductor material that is subdivided into a plurality of integrated circuit die regions;

in each integrated circuit die region, forming an integrated circuit structure, each of the integrated circuit structure is being substantially identical, each of the integrated circuit structures further including a plurality of spaced-apart conductive die bond pads arranged in a pattern;

providing a unitary, substantially planar prefabricated solid glass sheet having substantially the same size as the monolithic substrate wafer and having a plurality of prefabricated holes formed therethrough from an upper surface of the solid glass sheet to a lower surface of the solid glass sheet, the upper surface of the solid glass sheet being substantially coplanar with the lower surface of the solid glass sheet, the prefabricated holes being formed to provide a plurality of identical hole patterns, each hole pattern being identical to a corresponding pattern of die bond pads of an integrated circuit structure formed on the substrate wafer, each hole formed in the solid glass sheet having an associated conductive solder ball bond pad formed on the upper surface of the solid glass sheet in proximity to said prefabricated hole;

affixing the solid glass sheet to the wafer substrate utilizing an adhesive material disposed between the upper surface of the substrate wafer and the lower surface of the solid glass sheet such that each pattern of prefabricated holes in the solid glass sheet is aligned with an associated die bond pad pattern included in an associated integrated circuit structure;

for each conductive solder ball bond pad formed on the upper surface of the solid glass sheet, forming a region of conductive material in electrical contact with said conductive solder ball die bond pad and extending through the associated prefabricated hole in the solid glass sheet and through the adhesive material and in electrical contact with the die bond pad associated with said prefabricated hole; and for each conductive solder ball bond pad formed on the upper surface of the solid glass sheet, forming a conductive solder ball on said conductive solder ball bond pad to thereby provide an electrical connection between said conductive solder ball and an associated die bond pad.

5. A method as in claim 4, and wherein the solid glass sheet has a coefficient of thermal expansion that is substantially the same as the coefficient of thermal expansion of the substrate wafer.

6. A wafer scale structure as in claim 4, and wherein the substrate wafer comprises silicon.

7. A method as in claim 4, and further comprising:

forming a non-conductive mask on the upper surface of the solid glass sheet and patterned to facilitate formation of the conductive solder balls on the conductive solder ball bond pads.

8. A method of making a wafer scale structure for packaging integrated circuits, the method comprising:

providing a semiconductor substrate wafer that includes a plurality of substantially identical semiconductor integrated circuit structures formed therein, each integrated circuit structure including a plurality of conductive die bond pads formed on an upper surface of said integrated circuit structure and arranged in a pattern:

providing a unitary, substantially planar prefabricated solid glass sheet having substantially the same size as the semiconductor substrate wafer and having a plurality of prefabricated holes formed therethrough from an upper surface of the solid glass sheet to a lower surface of the solid glass sheet, the upper surface of the solid glass sheet being substantially coplanar with the lower surface of the solid glass sheet, the prefabricated holes being formed to provide a plurality of identical hole patterns, each hole pattern being identical to a corresponding pattern of die bond pads of an integrated circuit structure formed in the semiconductor substrate wafer, each prefabricated hole formed in the solid glass sheet having an associated conductive solder ball bond pad formed on the upper surface of the solid glass sheet in proximity to said prefabricated hole, the conductive solder ball bond pad including a portion that extends into said prefabricated hole to cover sidewalls of said prefabricated hole;

affixing the solid glass sheet to the wafer substrate utilizing adhesive material disposed between the upper surface of the wafer substrate and the lower surface of the solid glass sheet such, that each pattern of prefabricated holes in the solid glass sheet is aligned with an associated conductive die bond pad pattern formed on the integrated circuit die;

for each conductive solder ball bond pad, forming a conductive plug in the prefabricated hole in the solid glass sheet associated with said conductive solder ball bond pad and in electrical contact with the portion of said conductive solder ball bond pad extending into said prefabricated hole, the conductive plug extending through the adhesive material to be in electrical contact with the conductive die bond pad associated with said prefabricated hole; and for each conductive solder ball bond pad, forming a conductive solder ball thereon to thereby provide an electrical connection between said conductive solder ball and an associated conductive die bond pad.

9. A method of making a wafer scale structure for packaging integrated circuits, the method comprising:

providing a semiconductor substrate wafer that includes a plurality of substantially identical integrated circuit structures formed therein, each integrated circuit structure including a plurality of conductive die bond pads formed on an upper surface of said integrated circuit structure and arranged in pattern;

providing a unitary, substantially planar prefabricated solid glass sheet having substantially the same size as the semiconductor substrate wafer and having a plurality of prefabricated holes formed therethrough from an upper surface of the solid glass sheet to a lower surface of the solid glass sheet, the upper surface of the solid glass sheet being substantially coplanar with the lower surface of the solid glass sheet, the prefabricated holes being formed to provide a plurality of identical hole patterns, each hole pattern being identical to a corresponding pattern of die bond pads of an integrated circuit structure formed in the semiconductor substrate, each prefabricated hole formed in the solid glass sheet having a conductive solder ball bond pad structure associated therewith, the conductive solder ball bond pad structure including a first portion formed on the upper surface of the solid glass sheet in proximity to said prefabricated hole and a second portion that extends through the associated prefabricated hole and through the adhesive material to be in electrical contact with the die bond pad associated with said prefabricated hole; and for each conductive solder ball bond pad structure, forming a conductive solder ball on the first portion of said conductive solder ball bond pad structure to thereby provide an electrical connection between said conductive solder ball and an associated conductive die bond pad.

* * * * *